(12) United States Patent
Xiao

(10) Patent No.: US 11,257,737 B2
(45) Date of Patent: Feb. 22, 2022

(54) HEAT DISSIPATION DEVICE

(71) Applicant: NANNING FUGUI PRECISION INDUSTRIAL CO., LTD., Nanning (CN)

(72) Inventor: Dai-Ge Xiao, Shenzhen (CN)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 285 days.

(21) Appl. No.: 16/521,653

(22) Filed: Jul. 25, 2019

(65) Prior Publication Data
US 2020/0243420 A1    Jul. 30, 2020

(30) Foreign Application Priority Data

Jan. 24, 2019   (CN) .......................... 201910069775.7

(51) Int. Cl.
*H01L 23/473* (2006.01)
*F28D 15/00* (2006.01)
*H01L 35/30* (2006.01)
*F04B 7/00* (2006.01)

(52) U.S. Cl.
CPC ............ *H01L 23/473* (2013.01); *F28D 15/00* (2013.01); *F04B 7/0076* (2013.01); *F28F 2250/08* (2013.01); *F28F 2275/22* (2013.01); *H01L 35/30* (2013.01)

(58) Field of Classification Search
CPC .... H01L 23/473; H01L 35/30; F28F 2250/08; F28F 2275/22; F28D 15/00

USPC ........................................ 165/274; 417/413.1
See application file for complete search history.

(56) References Cited

U.S. PATENT DOCUMENTS

| | | | | |
|---|---|---|---|---|
| 3,497,642 A * | 2/1970 | Pintell | ...................... | H04R 7/14 381/426 |
| 4,498,850 A * | 2/1985 | Perlov | ...................... | F04B 43/14 417/322 |
| 4,915,017 A * | 4/1990 | Perlov | ...................... | F04B 43/02 92/5 R |
| 6,702,002 B2 * | 3/2004 | Wang | ................... | H01L 23/367 165/104.33 |
| 7,147,043 B2 * | 12/2006 | Lee | ......................... | F28F 3/12 165/104.21 |

(Continued)

FOREIGN PATENT DOCUMENTS

CN       2736933 Y     10/2005
CN    202034855 U     11/2011
(Continued)

*Primary Examiner* — Paul Alvare
(74) *Attorney, Agent, or Firm* — ScienBiziP, P.C.

(57) ABSTRACT

A heat dissipation device with forced coolant flow is provided which includes a base, coolant conduits, and a driving module. The conduit includes an inlet port, an extension segment, and an outlet port. The extension segment is connected to the base. The driving module includes a housing, a separating member, and two magnetic driving members. The separating member, being a thin magnetic plate, is positioned in the housing and defines a first chamber and a second chamber for coolant. The first chamber and the second chamber are connected to the inlet port and the outlet port and a flow of coolant can be initiated by alternating an electrical current feed to the two magnetic driving members on each side of the separating member.

8 Claims, 8 Drawing Sheets

(56) References Cited

U.S. PATENT DOCUMENTS

| | | | | |
|---|---|---|---|---|
| 7,637,312 | B1* | 12/2009 | Heydari | F04D 29/586 |
| | | | | 165/104.33 |
| 7,841,385 | B2* | 11/2010 | Campbell | H05K 7/20218 |
| | | | | 165/80.4 |
| 2004/0182088 | A1 | 9/2004 | Ghoshal et al. | |
| 2004/0265150 | A1* | 12/2004 | McElfresh | B81B 3/0035 |
| | | | | 417/413.1 |
| 2008/0240942 | A1* | 10/2008 | Heinrich | F04B 43/04 |
| | | | | 417/322 |

FOREIGN PATENT DOCUMENTS

| | | |
|---|---|---|
| CN | 204200532 U | 3/2015 |
| CN | 106679471 A | 5/2017 |
| CN | 107731766 A | 2/2018 |
| JP | 2000223871 A | 8/2000 |
| TW | 200823640 A | 6/2008 |
| TW | I316173 B | 10/2009 |
| WO | 2005071748 A1 | 8/2005 |

\* cited by examiner

HEAT DISSIPATION DEVICE

FIELD

The subject matter herein generally relates to heat dissipation devices with forced coolant flow.

BACKGROUND

A large amount of thermal energy is generated when an electronic device (e.g., a computer central processing unit) operates, and this thermal energy must be quickly removed from the central processing unit to avoid instability or damage to the central processing unit. In general, the surface of the central processing unit is often provided with a heat dissipation device to absorb thermal energy from the central processing unit. The heat energy absorbed by the heat dissipation device is then dissipated by ambient air.

Traditionally, the heat dissipation device includes a metal substrate that is attached to a central processing unit, and a number of fins are formed on the substrate. The substrate is pressed against the central processing unit and can cool sufficiently to ensure proper operation of the central processing unit. Most of the heat energy accumulated on the substrate is first transferred to the fins and then dissipated by the fins. However, the amount of thermal energy generated by advanced central processors has increased. The traditional heat dissipation device is no longer capable of effectively removing thermal energy from the central processor.

BRIEF DESCRIPTION OF THE DRAWINGS

Implementations of the present disclosure will now be described, by way of embodiments only, with reference to the attached figures.

DETAILED DESCRIPTION

Figure 1:
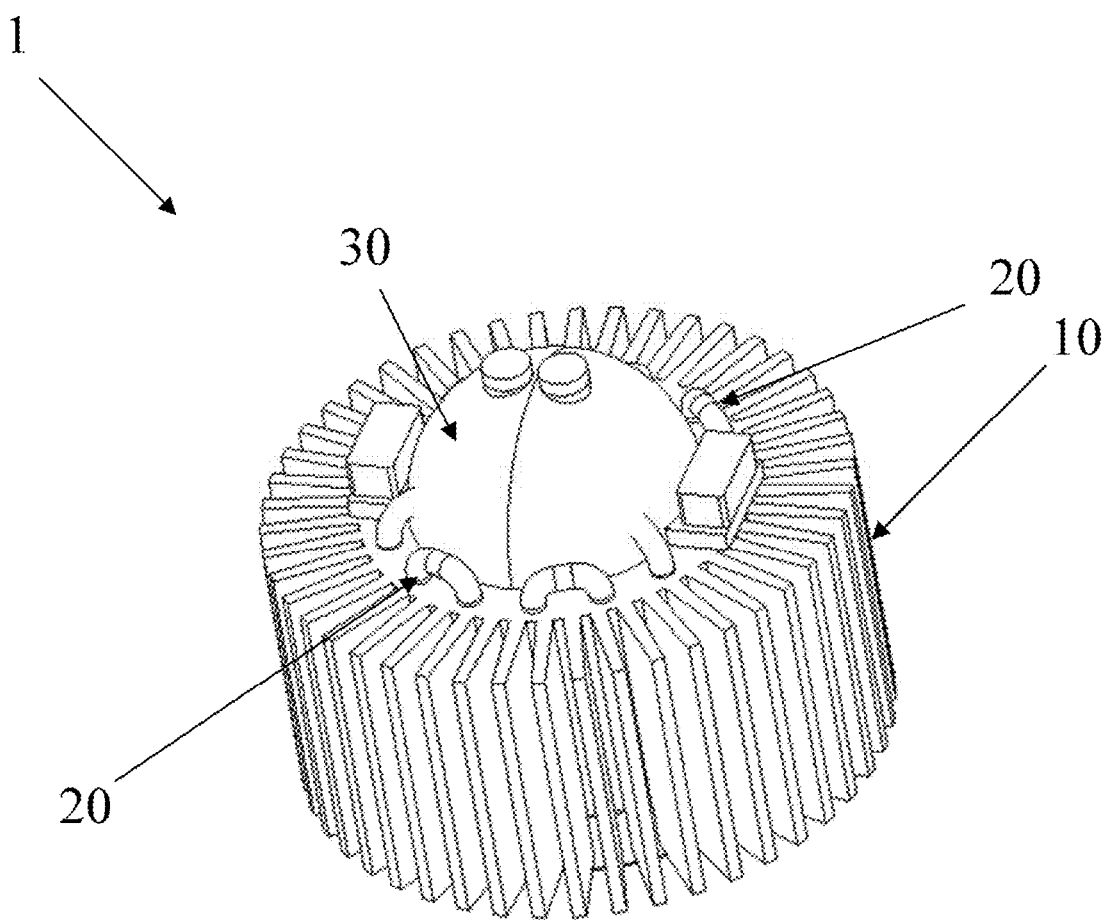
FIG. 1 shows a schematic view of a heat dissipation device of one embodiment of the disclosure

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures, and devices have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening devices, and is not necessarily limited to physical connections. The connection can be such that the objects are permanently connected or releasably connected. The term "substantially" is defined to be essentially conforming to the particular dimension, shape, or other feature that the term modifies, such that the device need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series, and the like.

Figure 2:
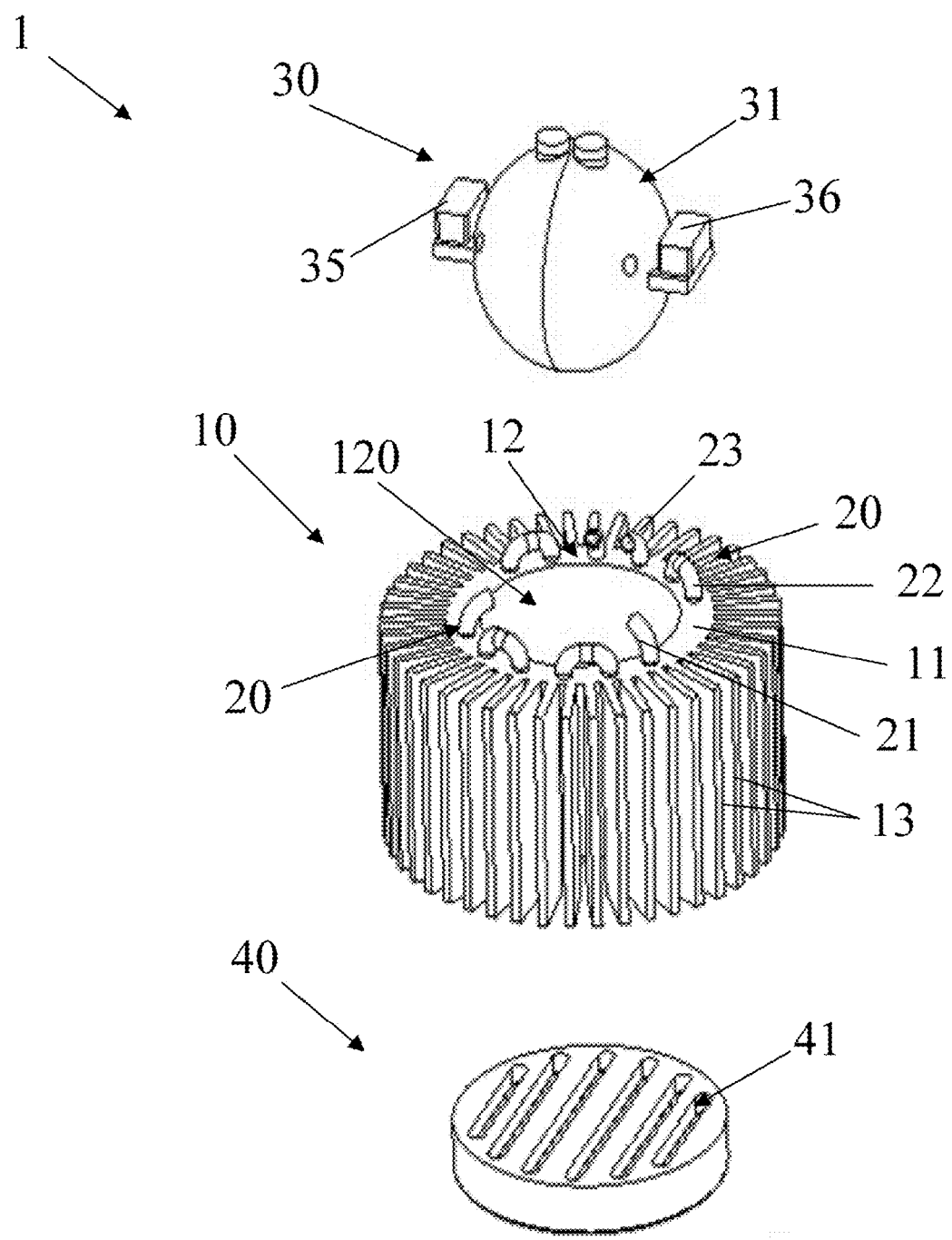
FIG. 2 shows an exploded view of the heat dissipation device of FIG. 1.

FIG. 1 shows a schematic view of a heat dissipation device 1 of one embodiment of the disclosure, and FIG. 2 shows an exploded view of the heat dissipation device 1 of FIG. 1. In accordance with one embodiment, the heat dissipation device 1 includes a base 10, a number of conduits 20, a driving module 30, and a heat conduction plate 40. The conduit 20 is configured to guide coolant from the driving module 30 through the base 10 and the heat conduction plate 40, so as to dissipate heat from the heat conduction plate 40 via the base 10.

In one embodiment, the base 10 includes a cylinder 11 and a number of heat sinks 13. The heat sinks 13a are arranged circumferentially around the cylinder 11 and extend outwardly for a predetermined length in a radial direction. In one embodiment, the cylinder 11 and the heat sinks 13 are formed integrally and made of material having relative high thermal conductivity (such as aluminum alloy or graphite sheet).

Figure 3:
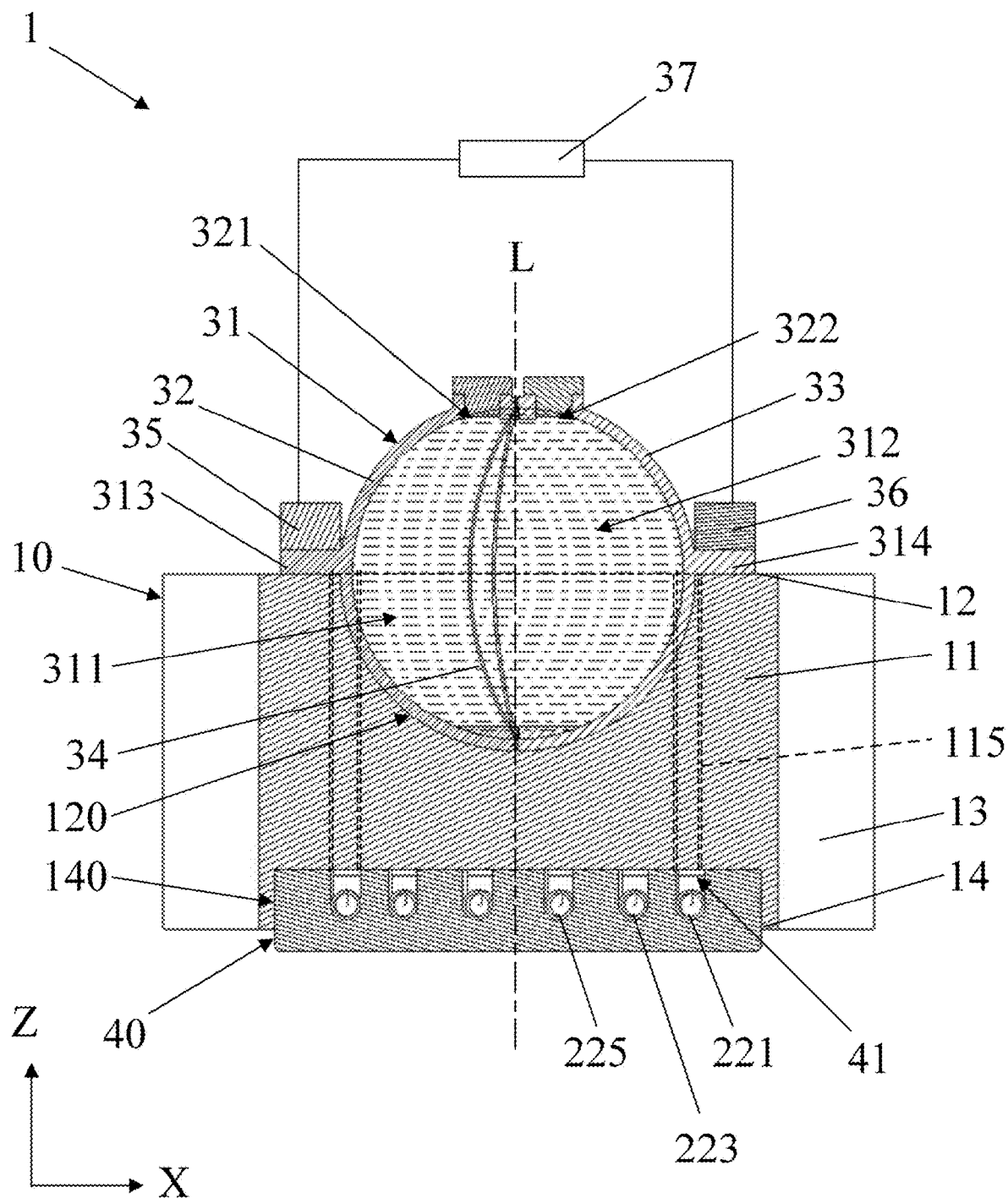
FIG. 3 shows a cross-sectional view of the heat dissipation device of FIG. 1.

FIG. 3 shows a cross-sectional view of the heat dissipation device 1 of FIG. 1. In one embodiment, the cylinder 11 has a height in a longitudinal direction (Z-axis direction. The cylinder 11 has an upper surface 12 and a lower surface 14. A recess 120 is formed on the upper surface 12. A shape of the recess 120 corresponds to a shape of a portion of the driving member 30 so as to receive the portion of the driving member 30 in the recess 30. In addition, a recess 140 is formed on the lower surface 14. A shape of the recess 140 corresponds to a shape of a portion of the heat conduction plate 40 so as to receive the portion of the heat conduction plate 40 in the recess 30. In one embodiment, the recess 120 has a semi-circular cross section, and the recess 140 has a rectangular cross section.

In one embodiment, as shown in FIG. 3, a number of channels 115 are formed in the cylinder 11 and extend parallel to the longitudinal direction L (Z-axis direction). Only two channels 115, adjacent to the driving members 35 and 36, are shown. In one embodiment, the channels 115 each extend from the upper surface 12 of the cylinder 11 to a bottom surface of the recess 140. The upper surface 12 of the cylinder 11 may be parallel to the bottom surface of the recess 140 and be perpendicular to the longitudinal direction L (Z-axis direction). In one embodiment, as shown in FIG. 2, an opening of the channel 115 that is formed on the upper surface 12 is located between an edge of the recess 120 and an outer edge of the cylinder 11.

Figure 4:
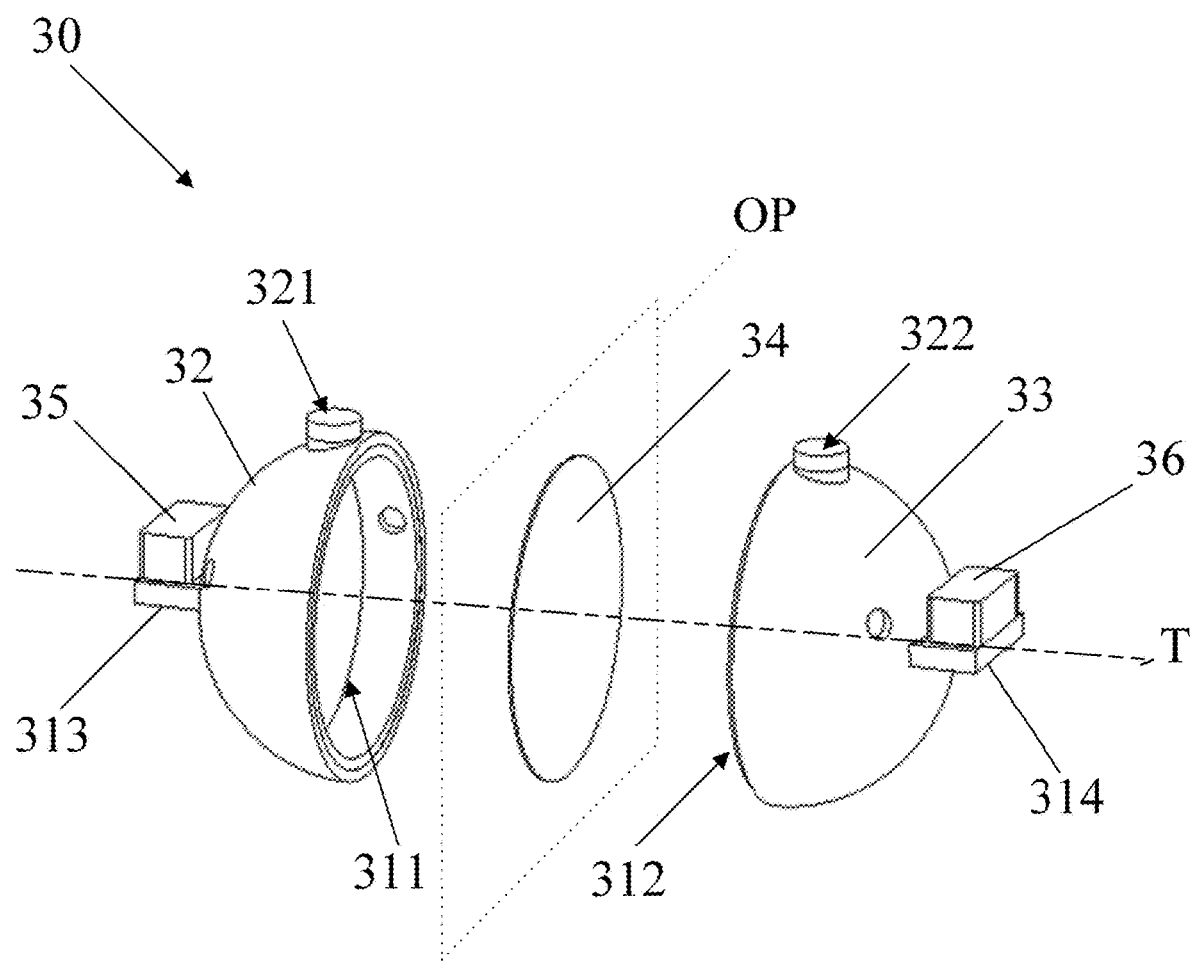
FIG. 4 shows an exploded view of a driving member of the heat dissipation device of FIG. 1, in accordance with one embodiment.

FIG. 4 shows an exploded view of the driving member 30 in accordance with one embodiment. In one embodiment, the driving module 30 includes a housing 31, a separating member 34, and a number of magnetic driving members (such as the first magnetic driving member 35 and the second magnetic driving member 36). In one embodiment, the housing 31 has a spherical structure and includes two semicircular housing members 32 and 33. The housing member 32 and 33 can be made of temperature-resistant plastic.

The separating member 34 is positioned in the housing 31 and defines a first chamber 311 and a second chamber 312 in the housing 31 for storage of coolant. In one embodiment, the separating member 34 is a thin circular disk and having a diameter that is slightly greater than an inside diameter of the housing 31. During the assembly of the driving member 30, the edge of the separating member 34 is sandwiched between the housing members 32 and 33 and the housing members 32 and 33 may be connected through ultrasonic welding technique so as to fix the separating member 34 in the housing 31. A sealing member may be placed between the housing members 32 and 33 to improve the sealing performance of the housing 31. The housing members 32 and 33 may include injection holes 321 and 322. The injection holes 321 and the injection hole 322 respectively communicate with the first chamber 311 and the second chamber 312 for the supply of the coolant into the first chamber 311 and the second chamber 312. The injection holes 321 and 322 may be sealed by a cover.

In one embodiment, the separating member 34 includes a magnetic element. The thin disk of the separating member 34 may be made of magnetic material (i.e., the separating member 34 itself is made of a metal disk having magnetism conductivity). Alternatively, the magnetic material and the thin disk are two individual components and connected together. When the magnetic material is attracted or repelled by magnetic force, the thin disk is deformed and shifts toward the first chamber or the second chamber.

The first magnetic driving member 35 and the second magnetic driving member 36 are connected to the housing 31 and arranged on the traversal axis T. The traversal axis T may be perpendicular to an extension plane OP at which the undeformed separating member 34 is located. In one embodiment, the housing 31 includes two platforms 313 and 314 extruded from the outer surface of the housing members 32 and 33. The first magnetic driving member 35 and the second magnetic driving member 36 are respectively placed on the platform 313 and the platform 314. In one embodiment, the first magnetic driving member 35 and the second magnetic driving member 36 are electromagnets and electrically connected to an electronic current controller 37. The electronic current controller 37 is configured to control electrical current that is applied to the first magnetic driving member 35 and the second magnetic driving member 36 to generate magnetic force.

Figure 5:
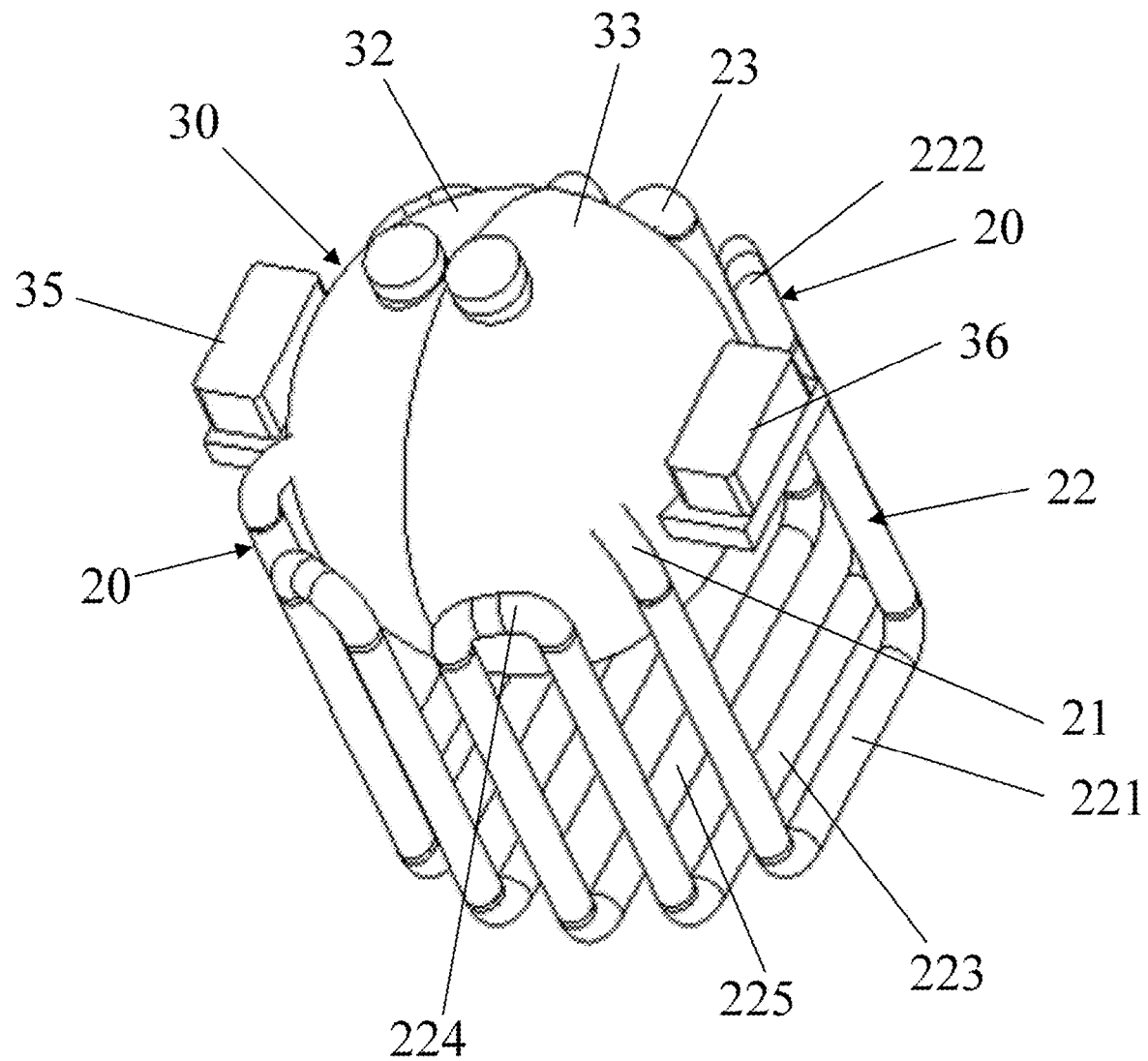
FIG. 5 shows a schematic view of a conduit connected to the driving member, in accordance with one embodiment.

FIG. 5 shows a schematic view of the conduit 20 connected to the driving member 30. In one embodiment, each of the conduits 20 includes an inlet port 21, an extension segment 22, and an outlet port 23 arranged in sequence. In one embodiment, the heat dissipation device 1 includes two conduits 20. One of the conduits 20 is connected with the housing member 31 by fixing the inlet port 21 and the outlet port 23 to openings formed on the housing member 31. The other conduit 20 is connected with the housing member 32 by fixing the inlet port 21 and the outlet port 23 to openings formed on the housing member 32. As a result, two closed-loop liquid flow paths for the coolant are formed. In one embodiment, the inlet port 21 is positioned farther than the outlet port 23 away from the separating member 34 (a junction of the housing member 32 and the housing member 33). In addition, an included angle formed between the inlet port 21 and the separating member 34 is greater than an included angle formed between the outlet port 23 and the separating member 34 for facilitating the discharge of the coolant from the first chamber 311 or the second chamber 312.

In one embodiment, the extension segment 22 includes a number of U-shaped sub-segments 221, 223, and 225, and a number of connecting sub-segments 222 and 224. The inlet port 21, the U-shaped sub-segment 221, the connecting sub-segment 222, the U-shaped sub-segment 223, the connecting sub-segment 224, the U-shaped sub-segment 225 and the outlet port 23 are connected in sequence. The U-shaped sub-segments 221, 223, and 225 extend along a height direction (Z-axis direction) of the base 30. In addition, the U-shaped sub-segments 221, 223, and 225 have different widths and are arranged along a direction that is parallel to the traversal axis T. Specifically, the U-shaped sub-segment 223 has a width greater than that of the U-shaped sub-segment 221, and the U-shaped sub-segment 225 has a greater width than that of the U-shaped sub-segment 223.

Referring to FIGS. 2 and 3, in one embodiment, longitudinal parts of U-shaped sub-segments 221, 223, and 225 are received in the channels 115, and curved parts of the U-shaped sub-segments 221, 223 and 225 are exposed to the recess 140 and are in direct contact with the heat conduction plate 40 received in the recess 140. In one embodiment, the heat conduction plate 40 includes a number of grooves 41, and the curved parts of the U-shaped sub-segments 221, 223, and 225 are inserted into the grooves 41. The connecting sub-segments 222 and 224 are projected from the upper surface 12 of the cylinder 11. In a circumferential direction of the cylinder 11, the connecting sub-segments 222 and 224 are positioned between the inlet port 21 and the outlet port 23.

Figure 6:
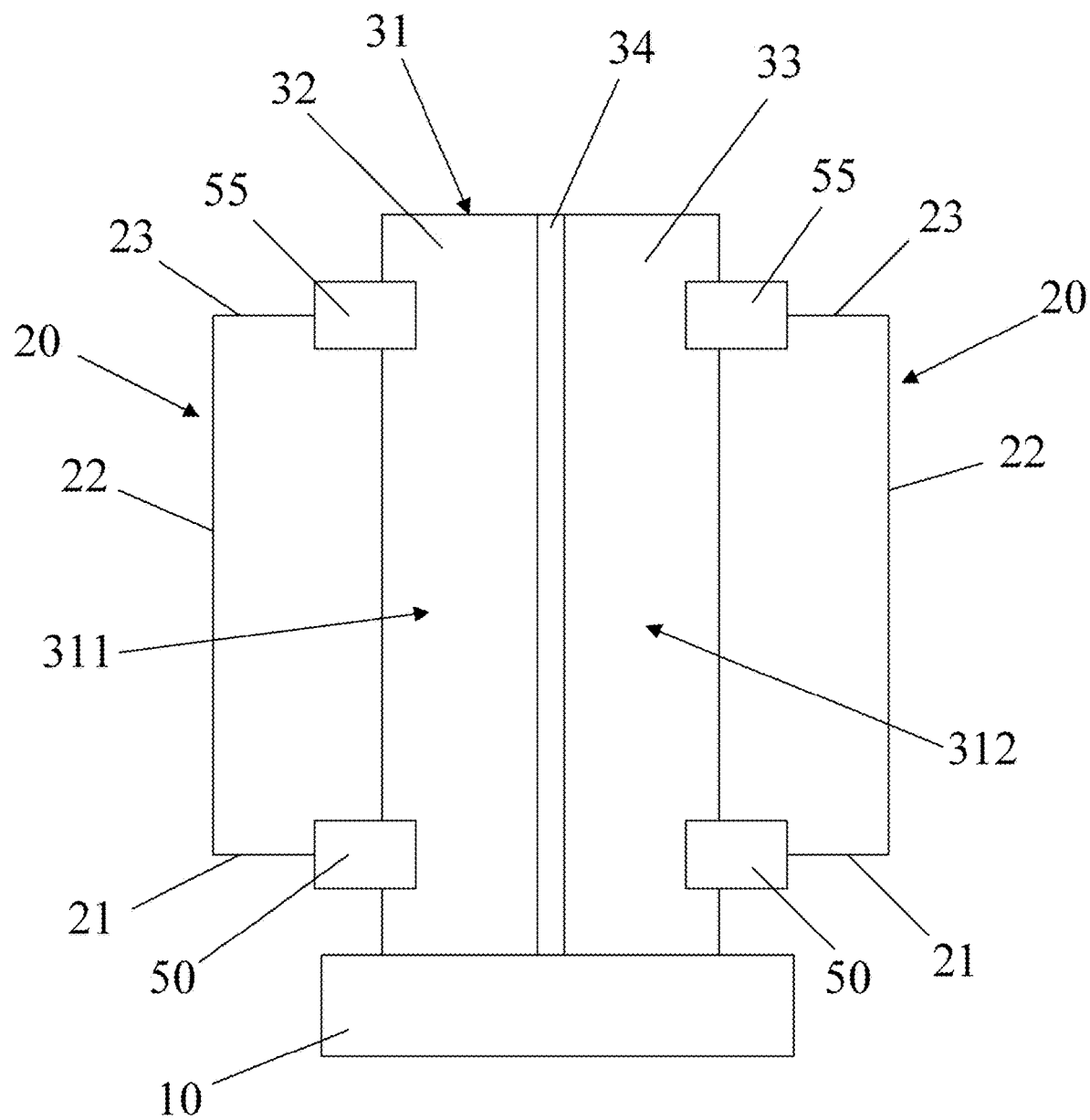
FIG. 6 shows a block diagram showing a relationship of a base, two conduits, and a driving module of the heat dissipation device of FIG. 1, in accordance with one embodiment.

FIG. 6 shows a connection relationship of the base 10, the conduits 20, and the driving module 30. In one embodiment, the inlet port 21 is closer than the outlet port 23 to the base 10 in a height direction, and a liquid surface of the coolant in the first chamber 311 or the second chamber 312 is below the outlet port 23. As a result, in the operation of the driving member 30, a reverse flow of the coolant into the outlet port 23 may be avoided.

In another embodiment, as shown in FIG. 6, the inlet port 21 and the outlet port 23 of the conduit 20 are respectively connected to the unidirectional valve 50 and the unidirectional valve 55, for controlling the flowing directions of the coolant. Specifically, the unidirectional valve 50 allows the coolant in the first chamber 311 or the second chamber 312 to flow into the conduit 20 via the inlet port 21 but blocks the coolant in the conduit 20 from flowing into the first chamber 311 or the second chamber 312. Moreover, the unidirectional valve 55 allows the coolant in the conduit 20 to flow into the first chamber 311 or the second chamber 312 via the outlet port 23, but blocks the coolant in the first chamber 311 or the second chamber 312 from flowing into the conduit 20 via the outlet port 23.

In accordance with one embodiment, an operating method of the heat dissipation device 1 is described below.

In one embodiment, the heat conduction plate 40 of the heat dissipation device 1 is attached on a heat-generating source (such as a CPU or chip, not shown in figures). The heat conduction plate 40 may be connected to the heat-generating source via conductive paste. Afterwards, the driving member 30 of the heat dissipation device 1 is driven to dissipate the heat.

Figure 7:
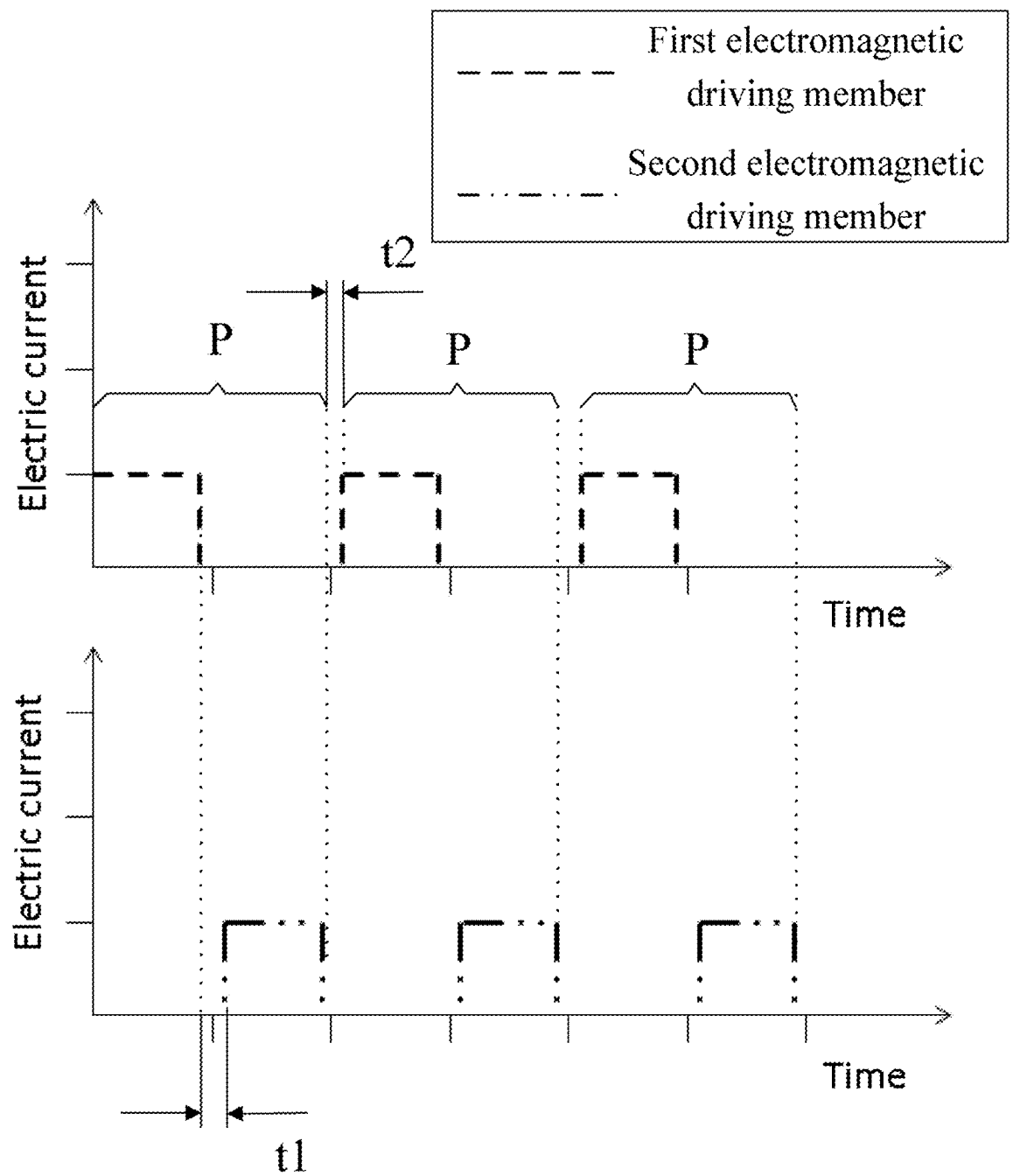
FIG. 7 shows a diagram of electrical current applied from an electronic current controller of a driving member 30 over time, in accordance with one embodiment.

FIG. 7 shows electrical current applied from the electronic current controller 37 of the driving member 30 during a period of time. In one embodiment, the electronic current controller 37 applies a preset electrical current to the first magnetic driving member 35 for a particular time. At this time, as shown in FIG. 3 (FIG. 3 shows two stages of the separating member 34 after being attracted by the magnetic force), the separating member 34 is deformed by magnetic attraction generated by the first magnetic driving member 35 and moves into the first chamber 311. Therefore, the coolant in the first chamber 311 is compressed by the separating member 34, and the coolant flows into the conduit 20 via the inlet port 21 and flows back to the first chamber 311 via the extension segment 22 and outlet port 23.

Figure 8:
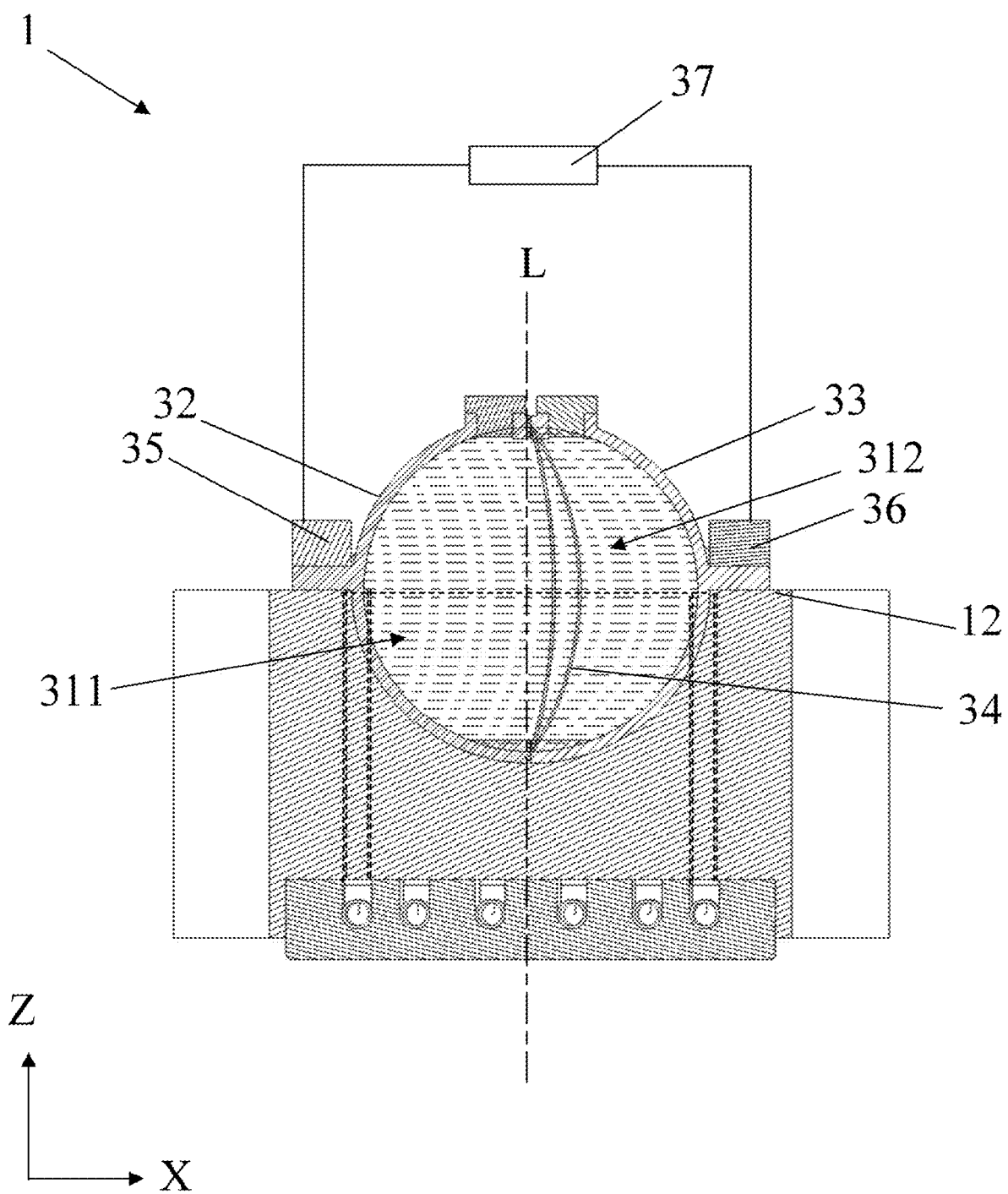
FIG. 8 shows a cross-sectional view of a heat dissipation device, in accordance with one embodiment.

Afterwards, electrical current from the electronic current controller 37 to the first magnetic driving member 35 is stopped, and the electronic current controller 37 applies a preset electrical current to the second magnetic driving member 36 for a particular time. At this time, as shown in FIG. 8 (FIG. 8 shows two stages of the separating member 34 after being attracted by the magnetic force), the separating member 34 is deformed by magnetic attraction towards the second magnetic driving member 36 and moves into the second chamber 312. Therefore, the coolant in the second chamber 312 is compressed by the separating member 34, and the coolant flows into the conduit 20 via the inlet port 21 and flows back to the second chamber 312 via the extension segment 22 and outlet port 23.

In one embodiment, the electronic current controller 37 sequentially applies electrical current to the first magnetic driving member 35 and the second magnetic driving member 36 in a time period P. The time period P for applying electrical current is repeated several times to actuate the flow of the coolant in two different closed-loop flow paths in the manner of a pump (i.e., the first chamber and the conduit connected to the first chamber and the second chamber and the conduit connected to the second chamber). Therefore, heat from the heat conduction plate 40 is dissipated by conducting heat to the base 20.

In one embodiment, a time interval t1 is programmed between operations for applying electronic current to the first magnetic driving member 35 and the second magnetic driving member 36. That is, the electronic current controller is configured to cut off electronic current between each alternation of supplying electronic current to one of the two magnetic driving members. In addition, a time interval t2 is programmed between two successive time periods P. In the time interval t1 and the time interval t2, the application of electronic current from the electronic current controller 37 to the first magnetic driving member 35 and the second magnetic driving member 36 is stopped, and the separating member 34 is not deformed. Therefore, the coolant in the conduits 20 can flow into the first chamber 311 or the second chamber 312 without hindrance caused by compression applied to the coolant in the first chamber 311 or the second chamber 312.

In one another embodiment, electronic current to the second magnetic driving member 36 is applied immediately after the application of electronic current to the first magnetic driving member 35. A vacant space in the first chamber 311 and the second chamber 312 may be preserved, and the first chamber 311 and the second chamber 312 are not filled with coolant.

The electrical current applied from electronic current controller 37 to the first magnetic driving member 35 and the second magnetic driving member 36 may be a constant value. Alternatively, the electrical current applied from electronic current controller 37 to the first magnetic driving member 35 and the second magnetic driving member 36 used in present time period P can be adjusted to a value that is less than the electrical current applied in previous time period P. As a result, magnetic attraction force for the separating member 34 is gradually decreased over time, such that a time of the coolant staying in the conduits may be prolonged and the cooling efficiency may be improved.

Embodiments of the heat dissipation device actively drive coolant to flow into conduits to convey more heat and faster from heat source to the base. Therefore, a heat dissipation efficiency of the heat dissipation device is improved.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A heat dissipation device, comprising:
    a base, wherein the base has an upper surface and a lower surface opposite to the upper surface, and each of the upper surface and the lower surface defines a recess;
    a plurality of conduits, sequentially comprising an inlet port, an extension segment, and an outlet port, wherein the extension segment is connected to the base;
    a driving module, comprising:
        a housing disposed in the recess of the upper surface and in direct contact with a bottom of the recess of the upper surface;
        a separating member disposed in the housing and defining a first chamber and a second chamber in the housing, wherein the separating member is a structure and comprises a magnetic element, each of the first chamber and the second chamber is configured to store coolant; and
        two magnetic driving members positioned corresponding to the separating member and disposed at two sides of the housing, respectively; and
    a heat conduction plate disposed in the recess of the lower surface and in direct contact with the extension segments of the conduits;
    wherein each of the first chamber and the second chamber is connected to the inlet port and the outlet port of at least one of the conduits, and the coolant is circulated in the first chamber and the second chamber via the conduits connected thereto.

2. The heat dissipation device as claimed in claim 1, wherein each of the plurality of conduits and the first chamber or the second chamber connected thereto forms a closed-loop fluid path.

3. The heat dissipation device as claimed in claim 1, wherein the extension segment of each of the plurality of conduits comprises a U-shaped sub-segment, and the U-shaped sub-segment extends along a height direction of the base.

4. The heat dissipation device as claimed in claim 1, wherein the separating member comprises a metal sheet having magnetic conductivity.

5. The heat dissipation device as claimed in claim 1, wherein the housing comprises two housing members, and the separating member is sandwiched between the two housing members.

6. The heat dissipation device as claimed in claim 1, wherein the heat dissipation device further comprises an electronic current controller, and the electronic current controller is configured to apply electronic currents alternately between the two magnetic driving members at a preset time period;

wherein during each of the time period, a time interval is programmed between operations for applying electronic currents to the two magnetic driving members.

7. The heat dissipation device as claimed in claim 1, wherein the two magnetic driving members are arranged along a traversal axis, and the traversal axis is perpendicular an extension plane at which the undeformed separating member is located.

8. The heat dissipation device as claimed in claim 1, wherein the heat dissipation device further comprises a number of unidirectional valves, and each of the inlet port and the outlet port of each of the plurality of conduits is connected the unidirectional valves for regulating flowing directions of the coolant.

* * * * *